(12) United States Patent
Ishida

(10) Patent No.: US 7,922,553 B2
(45) Date of Patent: Apr. 12, 2011

(54) ORGANIC ELECTROLUMINESCENT DISPLAY DEVICE AND PRODUCTION METHOD THEREOF

(75) Inventor: Kazuya Ishida, Kizugawa-shi (JP)

(73) Assignee: Sharp Kabushiki Kaisha, Osaka (JP)

( * ) Notice: Subject to any disclaimer, the term of this patent is extended or adjusted under 35 U.S.C. 154(b) by 347 days.

(21) Appl. No.: 12/293,611

(22) PCT Filed: Dec. 25, 2006

(86) PCT No.: PCT/JP2006/325801
§ 371 (c)(1),
(2), (4) Date: Sep. 19, 2008

(87) PCT Pub. No.: WO2007/113935
PCT Pub. Date: Oct. 11, 2007

(65) Prior Publication Data
US 2010/0231122 A1   Sep. 16, 2010

(30) Foreign Application Priority Data

Apr. 5, 2006   (JP) .................................. 2006-104281

(51) Int. Cl.
*H01J 9/00* (2006.01)
(52) U.S. Cl. .......................................... 445/24; 313/504
(58) Field of Classification Search .......... 313/498–512; 445/24–25; 428/690
See application file for complete search history.

(56) References Cited

U.S. PATENT DOCUMENTS

| 2002/0067123 A1 | 6/2002 | Seki et al. |
| 2003/0140982 A1 | 7/2003 | Seki et al. |
| 2005/0003569 A1 | 1/2005 | Seki et al. |
| 2005/0023969 A1 | 2/2005 | Omata et al. |
| 2005/0118328 A1 | 6/2005 | Seki et al. |
| 2005/0200273 A1* | 9/2005 | Nozawa ........................ 313/503 |
| 2005/0268984 A1 | 12/2005 | Seki et al. |
| 2009/0160331 A1 | 6/2009 | Omata et al. |

FOREIGN PATENT DOCUMENTS

| CN | 1640203 A | 7/2005 |
| EP | 0 880 303 A1 | 11/1998 |
| EP | 0 989 778 A1 | 3/2000 |
| EP | 1 211 916 A1 | 6/2002 |
| EP | 1 376 716 A2 | 1/2004 |
| EP | 1 376 717 A2 | 1/2004 |
| EP | 1 465 461 A1 | 10/2004 |
| EP | 1 793 650 A2 | 6/2007 |
| JP | 10-012377 A | 1/1998 |
| JP | 2005-203215 A | 7/2005 |

OTHER PUBLICATIONS

Official Communication issued in International Patent Application No. PCT/JP2006/325801, mailed on Mar. 27, 2007.

* cited by examiner

*Primary Examiner* — Anne M Hines
(74) *Attorney, Agent, or Firm* — Keating & Bennett, LLP

(57) ABSTRACT

An organic electroluminescent display device has a structure which suppresses a leakage current generated in an organic electroluminescent layer and achieves a low power consumption and excellent light-emitting characteristics. The organic electroluminescent display device includes a first electrode, an organic electroluminescent layer, and a second electrode, stacked in this order on a substrate, wherein the organic electroluminescent layer includes a conductive layer and a light-emitting layer, the conductive layer has a trapezoidal cross section which widens downwardly, and the light-emitting layer covers upper and side surfaces of the conductive layer.

2 Claims, 4 Drawing Sheets

ORGANIC ELECTROLUMINESCENT DISPLAY DEVICE AND PRODUCTION METHOD THEREOF

BACKGROUND OF THE INVENTION

1. Field of the Invention

The present invention relates to an organic electroluminescent (hereinafter, also referred to as an organic EL) display device and a production method thereof. More specifically, the present invention relates to an organic EL display device including an organic EL layer which is formed by a wet method such as an ink-jet method. The present invention further relates to a production method of such an organic EL display device.

2. Description of the Related Art

An organic EL display has been drawing attention as a next-generation flat panel display (FPD) because such a display is excellent in visibility such as a viewing angle and responsiveness and permits low power consumption, slim profile, and flexibility of the display itself. Such an organic EL display device is still inferior to a liquid crystal display (LCD) or a plasma display panel (PDP) in technical completeness or standard of industrial infrastructure. Therefore, practical use of the organic EL display device is still only loading on car audios or some mobile information devices. However, the organic EL display device is theoretically the most excellent FPD and therefore, future market expansion is expected for the display device.

Such an organic EL display device displays images by driving an organic EL panel having a configuration in which a light-emitting organic EL element is arranged in every pixel. The organic EL element has a structure in which an organic EL layer including a light-emitting layer is interposed between a pair of electrodes at least one of which has translucency. When a voltage is applied to the light-emitting layer, the organic EL element emits light. In addition to the light-emitting layer, a layer whose conductivity is higher than that of the light-emitting layer, such as a hole injection layer, is normally arranged as the organic EL layer in order to improve a light-emitting efficiency.

A low-molecular organic EL layer and a polymer organic EL layer are known as the organic EL layer. A method of forming a film by vacuum deposition is commonly used to form the low-molecular organic EL layer, but an uneven film tends to be formed by this method. Therefore, it is difficult to form a large organic EL layer by this method. In contrast, a wet method such as an ink-jet method, a nozzle coating method, and a printing method is commonly used to form the polymer organic EL layer. Among these, a method in which RGB pixels are pattern-formed on a substrate by an ink-jet method has been widely used, recently (for example, refer to Japanese Kokai Publication No. Hei-10-12377, Japanese Kokai Publication No. Hei-10-153967, and Japanese Kokai Publication No. 2002-334782).

However, the organic EL element prepared by the wet method generates a leakage current which does not contribute to light emission when a voltage is applied, which adversely influences the light emitting characteristics.

For this problem, an organic EL element in which a region where a light-emitting layer is formed is the same as or larger than a region where a hole injection/transport layer is formed is disclosed (for example, refer to WO 01/074121). Such an organic EL element generates no leak current and has excellent characteristics such as a high light-emitting efficiency. However, even if the light-emitting layer is formed to completely cover the hole injection/transport layer, a leakage current must be generated. Therefore, there is room for improvement in a reduction in power consumption and improvement in light-emitting characteristics.

SUMMARY OF THE INVENTION

In order to overcome the problems with the prior art, preferred embodiments of the present invention provide an organic EL display device in which generation of a leakage current in the organic EL layer is suppressed and a power consumption is low, and light-emitting characteristics are excellent, and also provide a production method of such an organic EL display device.

The present inventors made various investigations of an organic EL display device which can suppress generation of a leakage current in an organic EL layer formed by a wet method such as an ink-jet method. The inventors noted the shapes of a conductive layer and a light-emitting layer each constituting the organic EL layer. Then, the inventors made the following discoveries. If the conductive layer and the light-emitting layer are formed by a wet method, conventionally, a fluid material for the conductive layer contacts with a bank formed around the organic EL layer to be raised along the bank, and therefore the conductive layer has a larger thickness at the peripheral portion. As a result, at the peripheral portion, the thickness of the light-emitting layer formed on the conductive layer becomes thinner. Then, the inventors made the following discoveries. If the organic EL layer includes a conductive layer having a trapezoidal cross section which widens downwardly and a light-emitting layer which covers upper and side surfaces of the conductive layer, generation of the leakage current can be suppressed. As a result, an organic EL display device which has a lower power consumption and excellent light-emitting characteristics can be provided. Thus, the above-mentioned problems have been admirably solved, leading to completion of preferred embodiments of the present invention.

According to a preferred embodiment of the present invention, an organic electroluminescent display device includes a first electrode, an organic electroluminescent layer, and a second electrode, stacked in this order on a substrate, wherein the organic electroluminescent layer includes a conductive layer and a light-emitting layer, the conductive layer has a trapezoidal cross section which widens downwardly, and the light-emitting layer covers upper and side surfaces of the conductive layer.

According to the organic EL display device of a preferred embodiment of the present invention, the first electrode, the organic EL layer, and the second electrode are stacked on the substrate in this order. That is, according to the configuration of the organic EL display device of a preferred embodiment of the present invention, an organic EL element which includes the first electrode, the organic EL layer, and the second electrode is arranged on the substrate. The organic EL layer, and the first or second electrode are individually arranged in a pixel, generally. When a current flows into the respective organic EL layers, the light-emitting layer emits light. As a result, an image is displayed. The organic EL display device of a preferred embodiment of the present invention may be a bottom emission or top emission type organic EL display device.

The above-mentioned substrate normally includes: on a glass or resin substrate, wirings which are connected to the first and/or second electrodes to flow a current into the organic EL layer in each pixel; a circuit element arranged to control an amount of the current; and an insulating film arranged to electrically separate a layer where the wirings are arranged from a layer where the first electrode is arranged, for example. An active element such as a thin film transistor (TFT) is preferably used as the above-mentioned circuit element. With regard to the above-mentioned first and second electrodes, one is an anode and the other is a cathode. At least one of the first and second electrodes normally has translucency and transmits light emitted from the light-emitting layer.

If the organic EL display device according to a preferred embodiment of the present invention is a bottom emission type, a translucent material is used for the above-mentioned substrate and the first electrode. If the organic EL display device of a preferred embodiment of the present invention is a top emission type, a translucent material is used for the second electrode.

In a preferred embodiment of the present invention, the above-mentioned organic EL layer includes a conductive layer and a light-emitting layer. The conductive layer has a trapezoidal cross section which widens downwardly. The light-emitting layer covers upper and side surfaces of the conductive layer. The conductive layer is not especially limited as long as it shows a conductivity higher than that of the light-emitting layer at a normal temperature (25° C.). The conductive layer is also called buffer layer, hole transport layer, hole injection layer, electron transport layer, electron injection layer, and the like, generally. The conductive layer generally has a function of smoothly injecting a hole or an electron which has flowed from the first electrode, into the light-emitting layer, or a function of flattening the substrate surface. In the light-emitting layer, the hole injected from the anode is recombined with the electron injected from the cathode, and thereby light is emitted.

The organic EL layer may be a polymer organic EL layer or a low-molecular organic EL layer. However, in a preferred embodiment of the present invention, a polymer organic EL layer is preferable because such a polymer organic EL layer is suitably formed by a wet method. A polymer organic layer composed of a multilayer of an anode, a conductive layer, a light-emitting layer, and a cathode is preferably used.

In various preferred embodiments of the present invention, the conductive layer has a trapezoidal cross section which widens downwardly. In the present description, the trapezoidal cross section which widens downwardly means a cross section whose bottom surface has a width larger than a width of its upper surface. Accordingly, the upper surface may not be parallel to the bottom surface. For example, the conductive layer may have a hemispherical or substantially hemispherical cross section. The trapezoidal cross section which widens downwardly is formed when the conductive layer is preferably formed in the following manner: a droplet of a material for the conductive layer is applied by a wet method such as an ink-jet method, and this material is dried and solidified without excessively being wet and spread. In a preferred embodiment of the present invention, the conductive layer is formed into such a shape, and thereby a profile (thickness distribution) of the light-emitting layer on the conductive layer is controlled. That is, because of the conductive layer having a trapezoidal cross section which widens downwardly, the light-emitting layer formed on the conductive layer can cover the upper and side surfaces of the conductive layer, which can suppress the light-emitting layer from having a portion where the thickness is small at the peripheral portion. Thus, according to the organic EL layer of a preferred embodiment of the present invention, the conductive layer having a high conductivity can be sufficiently prevented from contacting with the second electrode, and therefore, generation of the leakage current can be suppressed.

According to a preferred embodiment of the present invention, the conductive layer has a trapezoidal cross section which widens downwardly. According to such a preferred embodiment, the light-emitting layer can be more surely formed to have a sufficient thickness near the end of the conductive layer when the light-emitting layer is formed on the conductive layer. Accordingly, the yield of the organic EL element can be improved when it is commercially produced, and the organic EL element can obtain a high productivity. Such an effect is remarkably exhibited particularly when the light-emitting layer is a layer formed by a wet method.

It can be possible in principle to suppress generation of the leakage current by forming the light-emitting layer to have a larger thickness, thereby increasing a distance between the conductive layer and the second electrode. However, if, in an organic EL element having a conventional structure, and the light-emitting layer is formed to have a thickness large enough to sufficiently reduce a leakage current, a luminance which is needed in practice is not obtained normally. This is because of a trade-off relationship: when the thickness of a light-emitting layer is increased, the lifetime of an organic EL element is extended but the luminance is reduced. However, according to various preferred embodiments of the present invention, the leakage current is sufficiently reduced and simultaneously the light-emitting layer can be thinned. Therefore, not only an improvement in light-emitting efficiency, attributed to the reduction in leakage current, but also an improvement in luminance, attributed to the thinning of the light-emitting layer can be satisfied. Also in such a point, the preferred embodiments of the present invention is excellent.

A mixture (PEDOT/PSS) of polyethylene dioxythiophene and polystyrene sulfonic acid and the like may be mentioned as a material for the conductive layer. A polyfluorene compound represented by the following formula (1) and the like may be mentioned as a material for the light-emitting layer.

Formula 1

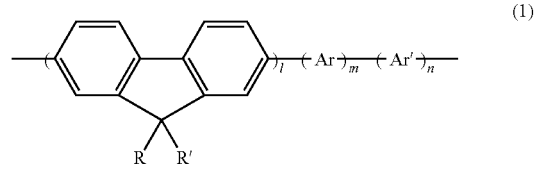

The polyfluorene compound represented by the above formula (1) is a copolymer compound of a fluorene ring having alkyl chains R and R' with a unit of one or more aryl compounds. In the above formula (1), each of R and R' represents an alkyl chain; each of Ar and Ar' represents a unit of an aryl compound; each of l and m is an integer of 1 or more; and n is an integer of 0 or 1 or more. Examples of the aryl compound include dimethylbenzene, pyridine, benzene, anthracene, spirobifluorene, carbazole, benzo amine, bipyridine, and benzothiadiazole. The above-mentioned polyfluorene compound preferably has hundreds of thousands of weight average molecular weights. A color emitted depends on a unit to be used for copolymerization and a ratio among l, m, and n.

The above-mentioned organic EL layer may include an intermediate layer. The intermediate layer is not especially limited as long as it has a function of preventing an electron which has been transported from the cathode through the light-emitting layer from being injected into the conductive layer. The formation of the intermediate layer extends the lifetime of the organic EL layer, normally. The organic EL layer including the intermediate layer may be composed of a multilayer of an anode, a conductive layer, an intermediate layer, a light-emitting layer, and a cathode. It is preferable that the intermediate layer has a conductivity equivalent to the conductivity of the light-emitting layer. Examples of a material for the intermediate layer include: poly[(9,9-dioctylfluorenyl-2,7-diyl)-co-(1,4-ethylenylbenzene)], poly[(9,9-dihexylfluorenyl-2,7-diyl)-co-(9,ethyl-3,6-carbazole)], and poly[(9,9-dihexylfluorenyl-2,7-diyl)-co-(2,5-p-xylene)]. Such a compound is dissolved into a nonpolar solvent to provide a liquid material for forming the intermediate layer. It is preferable that the thickness of the intermediate layer is half or less than the thickness of the light-emitting layer.

Preferred embodiments of the organic EL display device of the present invention are mentioned in more detail below.

It is preferable that the organic EL display device includes a bank around the organic electroluminescent layer. It is more preferable in the organic EL display device that the light-emitting layer is in contact with a wall surface of the bank. In the present description, the bank is not especially limited as long as it is a structure for separating the organic layers from each other. Due to the formation of such a bank, a fluid material for the organic EL layer can be maintained inside the region surrounded by the bank if the organic EL layer is formed by a wet method. In each pixel, the organic layer can be formed into a certain planar shape. In contrast, according to a conventional configuration, if the bank is formed around the organic EL layer, the organic EL material is wetted and spread along the bank, and as a result, the conductive layer at the peripheral portion has a thickness larger than a thickness at the center. Further, the light-emitting layer formed on the conductive layer has a smaller thickness at the peripheral portion. In contrast, according to a preferred embodiment of the present invention, the conductive layer is formed to have a trapezoidal cross section which widens downwardly by, for example, a method of controlling lyophilic and lyophobic properties of the bank surface. Accordingly, the light-emitting layer can be formed to have a large thickness at the peripheral portion and therefore the leakage current generated in the organic EL layer can be effectively suppressed. An insulating organic substance such as polyimide may be mentioned as a material for the bank.

It is preferable that the light-emitting layer has an H-shaped cross section. In the present description, the "H-shaped cross section" is a cross section both ends of which upwardly and downwardly project from the center portion. When the bank is arranged around the organic EL layer and the light-emitting layer is formed by a wet method such as an ink-jet method, the material for the light-emitting layer is wetted and spread along the bank, and therefore, the light-emitting layer is formed on the wall surface of the bank. As a result, the light-emitting layer has an H-shaped cross section. The thickness at the peripheral portion is sufficiently large because the light-emitting layer has such a shape. Thus, a layer having a relatively large conductivity can be formed to have a certain or larger thickness between the conductive layer and the cathode. As a result, the leakage current in the organic EL layer can be more effectively reduced.

Another preferred embodiment of the present invention provides a production method of an organic electroluminescent display device, the organic electroluminescent display device including a first electrode; an organic electroluminescent layer including a conductive layer and a light-emitting layer; the second electrode, stacked on a substrate in this order; and a bank around the organic electroluminescent layer, wherein the production method includes the steps of, in the following order: (lyophilic and lyophobic properties-giving step) subjecting a surface of the first electrode to a lyophilic treatment and subjecting a surface of the bank to a lyophobic treatment; (conductive layer-forming step) forming the conductive layer on the first electrode by a wet method; (step of giving a lyophilic property to the bank) reducing a lyophobic property on the surface of the bank; and (light-emitting layer-forming step) forming the light-emitting layer on the conductive layer by a wet method. According to such a production method of the organic EL display device of a preferred embodiment of the present invention, the conductive layer can be formed to have a small thickness and the light-emitting layer can be formed to have a large thickness at the portion near the bank. As a result, the leakage current in the organic EL layer can be reduced. Accordingly, such a method is preferably employed to produce the organic EL display device of a preferred embodiment of the present invention.

In the above-mentioned lyophilic and lyophobic properties-giving step, a lyophilic treatment is performed for the first electrode surface and a lyophobic treatment is performed for the bank surface. The methods for the lyophilic treatment and the lyophobic treatment are not especially limited. A plasma treatment and the like may be mentioned, for example.

In the above-mentioned conductive layer-forming step, a conductive layer is formed on the first electrode by a wet method. When a conductive layer is formed by a wet method, the first electrode surface tends to show an affinity to a liquid material for the conductive layer, but the bank surface tends to repel the liquid material for the conductive layer, because the first electrode surface is provided with the lyophilic property and the bank surface is provided with the lyophobic property by the above-mentioned lyophilic and lyophobic properties-giving step. As a result, the conductive layer tends to be formed to have a uniform thickness on the first electrode surface. Further, the conductive layer is formed to have a small thickness on the bank or not formed on the bank. Examples of the wet method employed for forming the conductive layer include: coating methods such as a spin coating method, an ink-jet method, a nozzle coating method, a slit coating method, a die coating method; and printing methods such as an offset printing method and an intaglio printing method; and a laser transfer method. Among these, coating by an ink-jet method and heating or natural drying are preferably used in combination.

In the above-mentioned step of giving a lyophilic property to the bank, the lyophobic property on the bank surface is reduced. As a method of reducing a lyophobic property on the bank surface, a rinse treatment using a solvent is preferably used, for example. That is, it is preferable that the step of reducing a lyophobic property is a step of treating the surface of the bank with a solvent. According to the method of treating the bank surface with a solvent, the lyophobic property on the bank surface can be easily reduced. The solvent is not especially limited as long as it can reduce the lyophobic property on the conductive layer surface. A solvent which does not dissolve the conductive layer is preferable. An aromatic solvent such as toluene, anisole, and xylene is preferably used if the conductive layer is made of a mixture of PEDOT and PSS.

In the above-mentioned light-emitting layer-forming step, the light-emitting layer is formed on the conductive layer by a wet method. When the light-emitting layer is formed by a wet method, the bank surface tends to show an affinity to a liquid material for the light-emitting layer more strongly than that to the liquid material for the conductive layer because the lyophobic property on the bank surface is reduced by the above-mentioned step of giving a lyophilic property to the bank. Accordingly, the light-emitting layer can be formed to have a large thickness at the portion near the bank. As a result, the light-emitting layer can be formed in the entire space between the conductive layer below the light-emitting layer and the second electrode above the light-emitting layer to have a thickness necessary to suppress the leakage current. The organic EL display device including the thus-prepared organic EL layer has a low power consumption and excellent light-emitting characteristics because the leakage current can be effectively reduced. The same methods as the wet method employed for forming the conductive layer can be employed for forming the light-emitting layer.

According to various preferred embodiments of the present invention, the conductive layer constituting the organic EL layer has a trapezoidal cross section which widens downwardly and the light-emitting layer has a shape covering the upper and side surfaces of the conductive layer. As a result, the light-emitting layer having a low conductivity can be formed in the entire space between the conductive layer and the electrode, and therefore generation of the leakage current in the organic EL layer can be suppressed. Accordingly, an organic EL display device which has a low power consumption and excellent light-emitting characteristics can be provided.

Other features, elements, steps, characteristics and advantages of the present invention will become more apparent from the following detailed description of preferred embodiments of the present invention with reference to the attached drawings.

BRIEF DESCRIPTION OF DRAWINGS

FIGS. 1A-1C are cross-sectional views schematically showing the organic EL element in Preferred Embodiment 1, wherein FIG. 1A shows the entire structure of the organic EL element, FIG. 1B shows the thickness profile of the conductive layer, and FIG. 1C shows the thickness profile of the light-emitting layer.

FIGS. 3A-3C are cross-sectional views schematically showing the organic EL element in Preferred Embodiment 2, wherein FIG. 3A shows the entire structure of the organic EL element, FIG. 3B shows the thickness profile of the conductive layer, FIG. 3C shows the thickness profile of the light-emitting layer.

FIGS. 4A-4C are cross-sectional views schematically showing the organic EL element in Comparative Preferred Embodiment 1, wherein FIG. 4A shows the entire structure of the organic EL element, FIG. 4B shows the thickness profile of the conductive layer, FIG. 4C shows the thickness profile of the light-emitting layer.

DETAILED DESCRIPTION OF THE PREFERRED EMBODIMENTS

The present invention is described in more detail below with reference to preferred embodiments using drawings, but the present invention is not limited to these Embodiments.

Preferred Embodiment 1

Figure 1A:
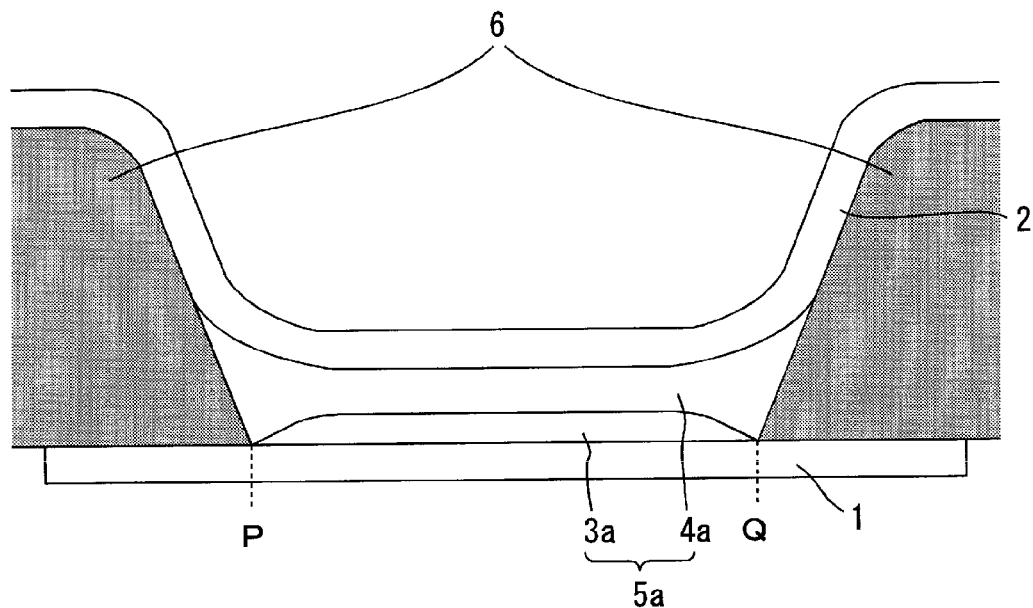
Figure 1B:
Figure 1C:

FIG. 1 is a cross-sectional view schematically showing an organic EL element in accordance with Preferred Embodiment 1. As shown in FIG. 1A, the organic EL element in the present preferred embodiment has a structure in which an organic EL layer 5a including a conductive layer 3a and a light-emitting layer 4a is interposed between an anode (the first electrode) 1 and a cathode (the second electrode) 2. The conductive layer 3a has a trapezoidal cross section which widens downwardly and has a thickness of about 60 nm at the center, as shown in the profile and thickness of the coating film in FIG. 1B. The light-emitting layer 4a has an H-shaped cross section and covers the upper and side surfaces of the conductive layer 3a. As shown in the profile and thickness of the coating film in FIG. 1C, the light-emitting layer 4 is preferably formed to have a thickness of about 80 nm or more, for example, over the entire conductive layer 3a.

Figure 2:
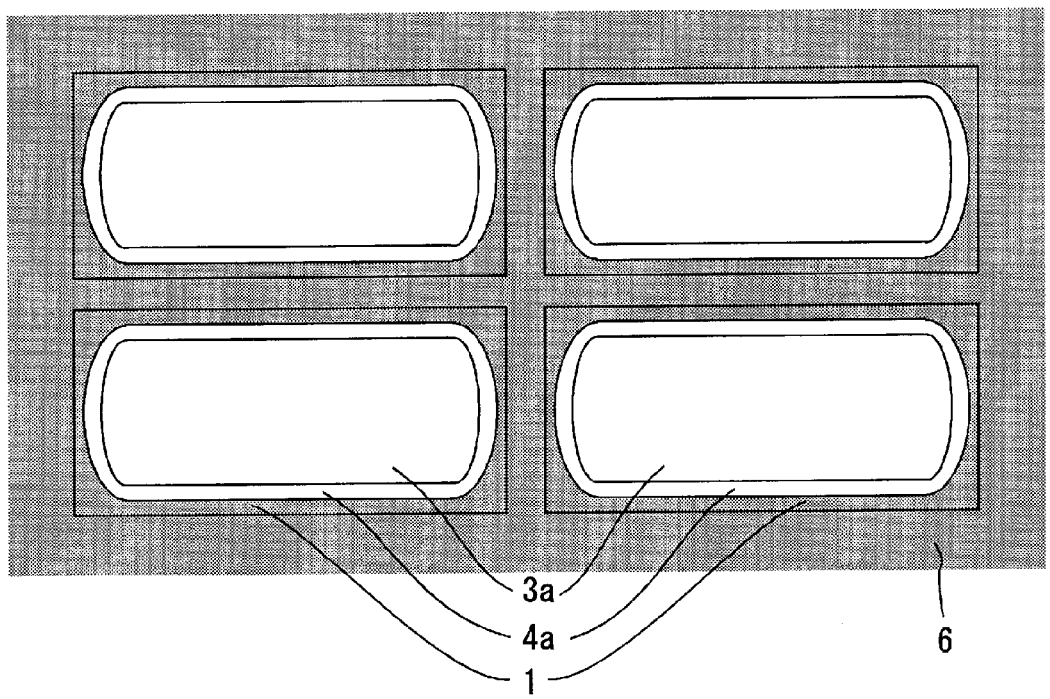
FIG. 2 is a planar view schematically showing the organic EL display device in Preferred Embodiment 1.

FIG. 2 is a planar view schematically showing an organic EL display device in accordance with Preferred Embodiment 1. As shown in FIG. 2, the organic EL display device in the present preferred embodiment has a structure in which organic EL elements having the cross-sectional configuration shown in FIG. 1 are partitioned by a bank 6 to be arranged in a matrix pattern. The bank 6 is arranged around the organic EL layer 5a to cover the outer edge of the anode 1.

The organic EL display device in Preferred Embodiment 1 was produced as follows.

"Lyophilic and Lyophobic Properties-Giving Step"

A substrate on which the anodes 1 and the bank 6 were arranged was prepared in the following manner, first. The anodes 1 made of indium tin oxide (ITO) were arranged in a matrix pattern. The bank 6 which included elliptical openings each having a long axis of about 180 μm and a short axis of about 60 μm, for example, was formed in a region except for the region where the anode 1 had been formed. Then, as a pretreatment before forming the organic EL layer 5a in the openings of the bank 6 on the substrate, a plasma treatment was performed using a plasma treatment apparatus (product of PVA TePla America, Inc., trade name: Plasma System 400). Specifically, an oxygen plasma treatment and oxygen-$CF_4$ plasma treatment were successively performed for the anode 1 surface and the bank 6 surface, thereby providing the anode 1 surface with a lyophilic property and providing the bank 6 surface with a lyophobic property. After the plasma treatments, the anode 1 surface had a water contact angle of about 10° and the bank 6 surface had an anisole contact angle of about 75°, for surface. The conditions for the plasma treatments are shown in the following Table 1. In Table 1, step 1 represents the oxygen plasma treatment and step 2 represents the oxygen-$CF_4$ plasma treatment.

TABLE 1

| | Gas | Flow rate (sccm) | Pressure (m bar) | Electrical power (W) | Time (s) |
|---|---|---|---|---|---|
| Step 1 | $O_2$ | 500 | 0.545 | 900 | 120 |
| Step 2 | $CF_4/O_2$ | 100/30 | 0.257 | 900 | 60 |

"Conductive Layer-Forming Step"

A coating liquid for forming the conductive layer was prepared. The coating liquid included the following components at the following proportions.

| | |
|---|---|
| PEDOT/PSS (product of H. C. Starck-VTech Ltd., trade name: Baytron P CH8000) | 1 part by weight |
| Water | 3 parts by weight |

-continued

| | |
|---|---|
| Ethanol | 4 parts by weight |
| Ethylene glycol | 2 parts by weight |

The coating liquid for forming the conductive layer, which included the above components at the above proportions, was applied, by an ink-jet method, to the openings of the bank 6 for which the plasma treatment had been performed. Then, the coating liquid was baked at 200° C. for 60 minutes to form the conductive layer 3a. The formed conductive layer 3a had a trapezoidal cross section widening downwardly and it had a thickness of about 60 nm at the center.

"Step of Giving a Lyophilic Property to the Bank"

The substrate on which the conductive layer 3a had been formed was immersed into anisol for about 2 minutes and then air-dried. Then, the substrate was subjected to baking at 200° C. for 10 minutes. Attributed to this solvent rinse treatment using anisol, the lyophobic property on the bank 6 surface was reduced and the anisol contact angle on the bank 6 surface was decreased from about 75° to about 50°, for example.

"Light-Emitting Layer-Forming Step"

A coating liquid for forming the light-emitting layer was prepared. The coating liquid including the following components at the following proportions was prepared. A polyfluorene compound represented by the following formula (1) was used as a green light-emitting polymer material.

| | |
|---|---|
| Green light-emitting polymer material | 1 part by weight |
| Xylene | 60 parts by weight |
| Tetralin | 60 parts by weight |

Formula 2

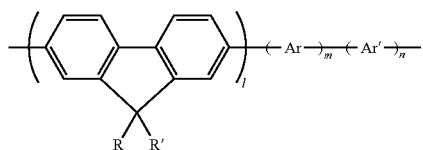

(1)

According to the green light-emitting polymer material, in the above formula (1), each of R and R' to which a fluorene ring is bonded represents an alkyl chain; each of Ar and Ar' represents an aryl compound unit; each of l and m is an integer of 1 or more; and n is an integer of 0 or 1 or more.

The green light-emitting polymer material had hundreds of thousands of weight average molecular weights.

The coating liquid for forming the light-emitting layer, which included the above components at the above proportions, was applied to the openings of the bank 6 where the conductive layer 3a had been formed and for which the step of giving a lyophobic property to the bank had been performed by an ink-jet method. Then, the coating liquid was baked at 200° C. for 60 minutes under nitrogen atmosphere. As a result, a light-emitting layer 4a was formed. The formed light-emitting layer 4a had an H-shaped cross section as shown in FIG. 1(c) and it had the smallest thickness of about 80 nm, for example, at the center. In the present preferred embodiment, the conductive layer 3a had a trapezoidal cross section widening downwardly. Therefore, the light-emitting layer 4a which had a shape covering the entire conductive layer 3a and which had a thickness of about 80 nm or more, for example, could be easily formed. As a result, the light-emitting layer 4a having a thickness of about 80 nm or more, for example, exists between the conductive layer 3a and the cathode 2, and therefore the leakage current can be reduced.

"Cathode-Forming Step and Successive Steps"

After the light-emitting layer 4a was formed, calcium and silver were deposited on the light-emitting layer 4a and the bank 6 by a vacuum deposition method. As a result, the cathode 2 was formed. Then, the region where the organic EL element had been formed on the substrate was sealed with a glass cap under nitrogen atmosphere. As a result, an organic EL display device was completed.

Preferred Embodiment 2

Figure 3A:
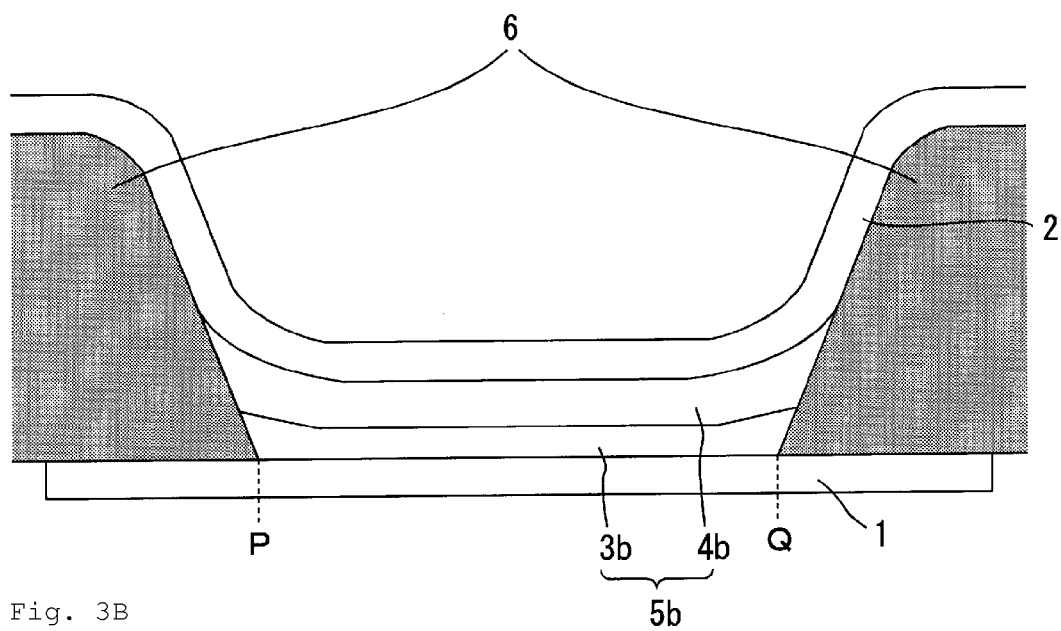
Figure 3B:
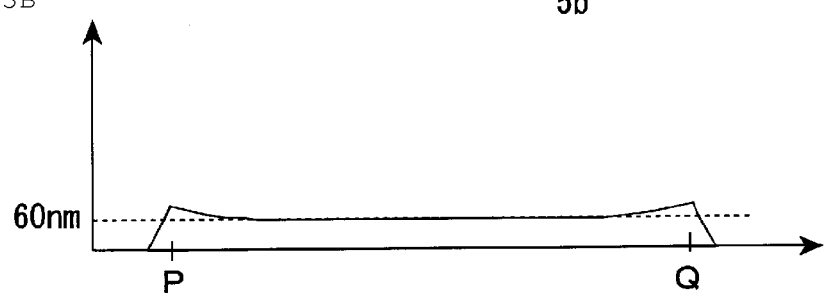
Figure 3C:
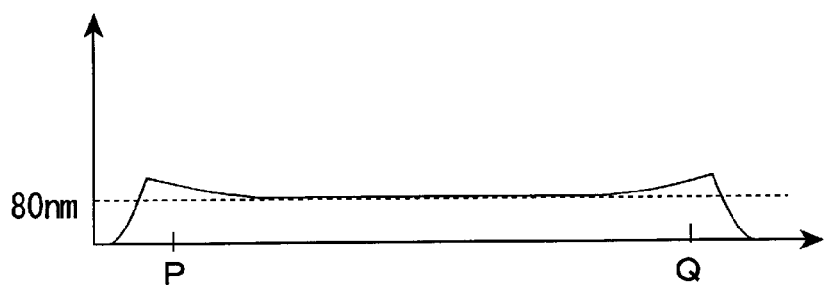

In Preferred Embodiment 2, an organic EL display device was produced in the same manner as in Preferred Embodiment 1, except that a coating liquid for forming the conductive layer which contained ethylene carbitol 2 parts instead of the ethylene glycol was used in the conductive layer-forming step. FIG. 3 is a cross-sectional view schematically showing an organic EL element in Preferred Embodiment 2. As shown in FIG. 3A, the formed conductive layer 3b had a U-shaped cross section both ends of which had a larger thickness. The light-emitting layer 4b had a U-shaped cross section both ends of which had a larger thickness. In the present preferred embodiment, the bank 6 was provided with the lyophobic property-reducing treatment and then the light-emitting layer 4b was formed. Therefore, an area of a region where the light-emitting layer 4b adhered to the bank 6 was larger than an area of a region where the conductive layer 3b adhered to the bank 6. The conductive layer 3b had a thickness of 60 nm at the center, as shown in FIG. 3B. The light-emitting layer 4b covered only the upper surface of the conductive layer 3b, and as shown in FIG. 3C, it had the smallest thickness of about 80 nm, for example, at the center. In the present preferred embodiment, the light-emitting layer 4b which covered the entire conductive layer 3b and preferably had a thickness of 80 nm or more, for example, could be easily formed. As a result, the light-emitting layer 4b having a thickness of about 80 nm or more, for example, exists between the conductive layer 3b and the cathode 2, and therefore the leakage current can be reduced.

Comparative Preferred Embodiment 1

Figure 4A:
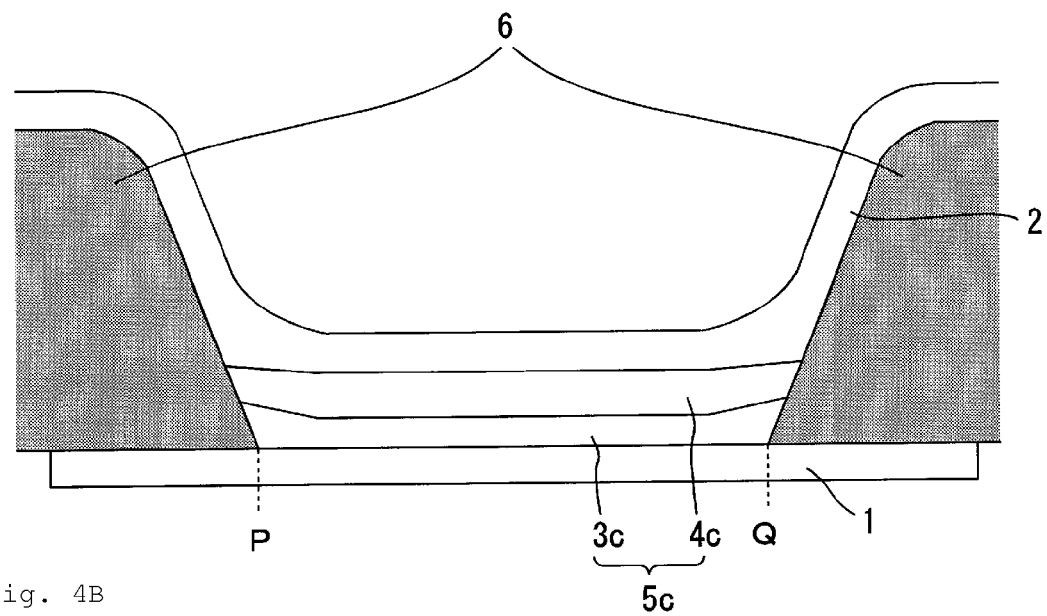
Figure 4B:
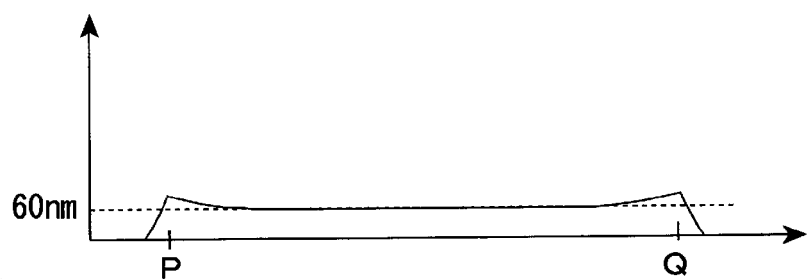
Figure 4C:
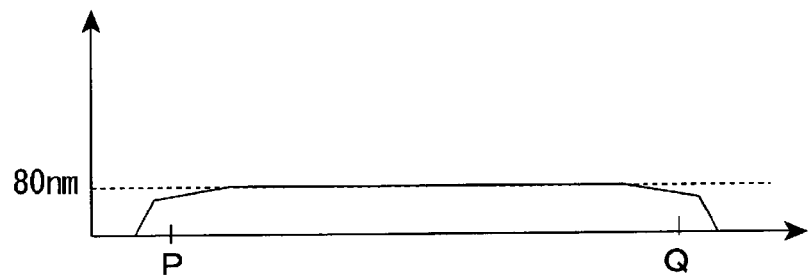

In Comparative Preferred Embodiment 1, an organic EL display device was produced in the same manner as in Preferred Embodiment 2, except that the step of giving a lyophobic property to the bank was omitted. As shown in FIG. 4A, the formed conductive layer 3c had a U-shaped cross section both ends of which had a larger thickness. In contrast, a light-emitting layer 4c had a U-shaped cross section both ends of which had a smaller thickness and the light-emitting layer 4c covered only the upper surface of the conductive layer 3c because the lyophobic property-reducing treatment was not performed for the bank before forming the light-emitting layer 4c. The conductive layer 3c had a thickness of about 60 nm at the center, as shown in FIG. 3B. In contrast, the light-emitting layer 4c covered the entire conductive layer 3c, as shown in FIG. 4A, but it had the smallest thickness of about 80 nm or less at the both ends, as shown in FIG. 3C. At such a portion where the light-emitting layer 4c has a small thickness, the distance between the conductive layer 3c and the cathode 2c is small, and therefore the leakage current tends to be generated.

"Evaluation Test"

The organic EL display devices in Preferred Embodiments 1 and 2 and Comparative Embodiment 1 were measured for a current density and a light-emitting efficiency. The current density is a value obtained when a voltage of 1.5 V was applied to the organic EL element. The light-emitting efficiency was a value measured when the organic EL element emitted light at a luminance of 300 cd/m². Table 2 shows the results.

TABLE 2

|  | Current density (mA/cm²) | Light-emitting efficiency (cd/A) |
| --- | --- | --- |
| Example 1 | 0.000012 | 11.5 |
| Example 2 | 0.000011 | 11.3 |
| Comparative Example 1 | 0.034 | 6.7 |

As clearly shown in the above Table 2, each of the organic EL display devices in Preferred Embodiments 1 and 2 showed a smaller current density and a higher light-emitting efficiency, than those of the organic EL display device in Comparative Example 1. Accordingly, the effect of reducing the leakage current, attributed to preferred embodiments of the present invention, could be determined. The results of the evaluation test shows that the organic EL display devices in Preferred Embodiments 1 and 2 are equivalent in terms of light-emitting characteristics. However, if it is taken into consideration that the thickness profile of the conductive layer is changed when unintended changes of the production conditions occur, the conductive layer in Preferred Embodiment 1 is more suitable for suppressing a shortage in thickness of the light-emitting layer at the both ends, than the conductive layer in Preferred Embodiment 2 has. The conductive layer in Preferred Embodiment 1 is more excellent than that in Preferred Embodiment 2 because the thickness of the light-emitting layer can be more surely maintained to a predetermined value or more over the entire conductive layer. That is, if the organic EL display device is commercially produced, the thickness profile in Preferred Embodiment 1 is excellent in terms of reduction in leakage current.

The present application claims priority under the Paris Convention and the domestic law in the country to be entered into national phase on Patent Application No. 2006-104281 filed in Japan on Apr. 5, 2006, the entire contents of which are hereby incorporated by reference.

In the present description, if the term "or more" is used, the value described (boundary value) is included.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A production method of an organic electroluminescent display device including a first electrode, an organic electroluminescent layer including a conductive layer and a light-emitting layer, a second electrode, stacked on a substrate in this order, and a bank around the organic electroluminescent layer, the production method comprising the sequentially performed steps of:

subjecting a surface of the first electrode to a lyophilic treatment and subjecting a surface of the bank to a lyophobic treatment;

forming the conductive layer on the first electrode by a wet method;

reducing a lyophobic property on the surface of the bank; and forming the light-emitting layer on the conductive layer by a wet method.

2. The production method of the organic electroluminescent display device according to claim 1, wherein the step of reducing the lyophobic property is a step of treating the surface of the bank with a solvent.

* * * * *